(12) United States Patent
Chikagawa et al.

(10) Patent No.: US 6,403,200 B2
(45) Date of Patent: *Jun. 11, 2002

(54) INSULATOR CERAMIC COMPOSITION

(75) Inventors: Osamu Chikagawa, Moriyama; Naoya Mori, Omihachiman, both of (JP)

(73) Assignee: Murata Manufacturing Co., Ltd. (JP)

( * ) Notice: Subject to any disclaimer, the term of this patent is extended or adjusted under 35 U.S.C. 154(b) by 0 days.

This patent is subject to a terminal disclaimer.

(21) Appl. No.: 09/789,375

(22) Filed: Feb. 20, 2001

(30) Foreign Application Priority Data

Mar. 6, 2000 (JP) .................. 2000-060799

(51) Int. Cl.$^7$ .................................. B32B 15/00
(52) U.S. Cl. ................ 428/209; 501/10; 501/11
(58) Field of Search ................. 501/11, 10

(56) References Cited

U.S. PATENT DOCUMENTS

| | | | |
|---|---|---|---|
| 3,899,340 A | * 8/1975 | Malmendier | 501/10 |
| 4,355,114 A | * 10/1982 | Hang et al. | 501/10 |
| 5,079,194 A | * 1/1992 | Jean et al. | 501/17 |
| 5,256,470 A | * 10/1993 | Jean et al. | 428/209 |
| 6,329,715 B1 | * 12/2001 | Hayashi | 257/528 |

FOREIGN PATENT DOCUMENTS

GB 2355260 A 4/2001
JP 05-238774 9/1993

OTHER PUBLICATIONS

WPI Abstract Accession No. 1984–116946[19] & JP590054106 A (Nippon Electric) Mar. 28, 1984. See Abstract.

WPI Abstract Accession No. 1986–290564[44] & SU1217851 A (Drobyshevskaya) Mar. 15, 1986. See Abstract.

* cited by examiner

Primary Examiner—Deborah Jones
Assistant Examiner—Gwendolyn Blackwell-Rudasill
(74) Attorney, Agent, or Firm—Ostrolenk, Faber, Gerb & Soffen, LLP

(57) ABSTRACT

An insulator ceramic composition making it possible to obtain a sintered material which can be fired at low temperature of 1000° C., can be co-sintered with Ag and Cu, exhibits superior mechanical strength, exhibits high Q value and is appropriate for using high frequencies, is provided. The insulator ceramic composition is composed of (A) an MgO—MgAl$_2$O$_4$ ceramic powder, and (B) a glass powder containing silicon oxide in a proportion of about 13 to 50 weight % in terms of SiO$_2$, boron oxide in a proportion of about 3 to 60 weight % in terms of B$_2$O$_3$, and aluminum oxide in a proportion of 0 to about 20 weight % in terms of Al$_2$O$_3$.

19 Claims, 4 Drawing Sheets

INSULATOR CERAMIC COMPOSITION

BACKGROUND OF THE INVENTION

1. Field of the Invention

The present invention relates to insulator ceramic compositions used, for example, for multilayer circuit substrates, and more specifically, it relates to insulator ceramic compositions which can be appropriately used for hybrid multilayer circuit substrates in order to mount semiconductor elements and various electronic parts, and which can be fired together with conductive materials such as copper and silver.

2. Description of the Related Art

In recent years, high-speed and high frequency electronic equipment has been increased. In electronic parts mounted on the electronic equipment, high-speed and the high integration are required too, and furthermore, a highly densified mounting is required. In order to fulfill the aforementioned requirements, multilayer circuit substrates have hitherto been used as substrates for mounting the semiconductor elements and various electronic parts thereon. In the multilayer circuit substrates, conductor circuits and electronic part functional elements are integrated in the substrates so that the electronic equipment can be miniaturized.

As the materials constituting the aforementioned multilayer circuit substrates, alumina has been used frequently.

The firing temperature of alumina is relatively high at 1500 to 1600° C. Therefore, as the materials of the conductor circuits integrated in the multilayer circuit substrates made of alumina, high melting point metals, for example, Mo, Mo—Mn, and W, usually had to be used. There was a problem, however, in that these high melting point metals exhibit high electrical resistance.

Therefore, it is strongly required to use, as a conductor material, a low electrical resistance and inexpensive metal as copper compared to the aforementioned high melting point metals. In order to make it possible to use copper as a conductor material, it was proposed to use glass ceramics, crystallized glass, etc., which can be fired at a low temperature of 1000° C. or less (for example, Japanese Unexamined Patent Application Publication No.5-238774).

There was a problem, however, in that the aforementioned well-known substrate materials capable to being fired at a low temperature are likely not to fulfill the high mechanical strength and the high Q value requirements together.

SUMMARY OF THE INVENTION

The object of the present invention is to conquer the aforementioned drawbacks in the conventional techniques so as to provide an insulator ceramic which can be obtained by low temperature firing, can be fired together with relatively low melting point conductor materials such as silver and copper, exhibits superior mechanical strength, exhibits high Q value and exhibits superior high frequency characteristics.

Another object of the present invention is to provide a ceramic multilayer substrate, a ceramic electronic part and a laminated ceramic electronic part which are constituted using the aforementioned insulator ceramic, exhibit superior mechanical strength, exhibit high Q value and exhibit superior high frequency characteristics.

The present invention was made to solve the aforementioned problems. An insulator ceramic composition according to the present invention is characterized in comprising: (A) an MgO—MgAl$_2$O$_4$ ceramic powder; and (B) a glass powder containing silicon oxide in a proportion of about 13 to 50 weight % in terms of SiO$_2$, boron oxide in a proportion of about 3 to 60 weight % in terms of B$_2$O$_3$, and aluminum oxide in a proportion of 0 to about 20 weight % in terms of Al$_2$O$_3$.

In 100 weight % of the aforementioned glass powder, silicon oxide is contained in a proportion of about 13 to 50 weight %, preferably about 20 to 30 weight % in terms of SiO$_2$. When the content of silicon oxide is about 13 weight % or less, the degree of crystallinity of the obtained sintered material is lowered, and the Q value is lowered. On the contrary, when the content of silicon oxide is about 50 weight % or more, the melting point of the glass is increased.

In the aforementioned glass powder, boron oxide is contained in a proportion of about 3 to 60 weight %, preferably about 30 to 60 weight % in terms of B$_2$O$_3$. Boron oxide primarily functions as a flux. When the content of boron oxide is about 3 weight % or less in terms of B$_2$O$_3$, the melting point becomes too high, on the contrary, when more than about 60 weight %, the moisture resistance of the obtained sintered material is lowered.

Furthermore, in the aforementioned glass powder, aluminum oxide is contained in a proportion of 0 to about 20 weight % in terms of Al$_2$O$_3$. The content of aluminum oxide may be 0 weight % in terms of Al$_2$O$_3$. That is, aluminum oxide is not necessarily contained. Therefore, the insulator ceramic composition according to the present invention containing no aluminum oxide is expressed as the insulator ceramic composition comprising the aforementioned (A) an MgO—MgAl$_2$O$_4$ ceramic powder, and (B) a glass powder containing silicon oxide in a proportion of about 13 to 50 weight % in terms of SiO$_2$ and boron oxide in a proportion of about 3 to 60 weight % in terms of B$_2$O$_3$.

In the case in which the aforementioned aluminum oxide is present, when the content is more than about 20 weight % in terms of Al$_2$O$_3$, a fine sintered material cannot be obtained, and the Q value becomes small. In the case in which aluminum oxide is present, the lower limit thereof is more than 0 weight % in terms of Al$_2$O$_3$.

In the present invention, as the aforementioned glass powder, the one further containing at least an alkaline earth metal oxide selected from the group consisting of BaO, SrO, CaO and MgO in a proportion of about 10 to 40 weight % relative to the entirety of the aforementioned glass powder is preferable. More preferably, the aforementioned alkaline earth metal oxide is added to be contained in a proportion of about 20 to 30 weight % relative to the entirety of the glass powder.

The aforementioned alkaline earth metal oxide has a function of lowering the melting temperature in the manufacturing of the glass and functions as a component constituting the crystal in the crystallized glass. When the content of the aforementioned alkaline-earth metal oxide is less than about 10 weight %, the melting temperature may be increased, and when more than about 40 weight %, the deposition amount of crystals may be increased and the strength of the substrate may be lowered.

In another aspect of the present invention, the aforementioned glass powder contains at least an alkali metal oxide selected from the group consisting of Li$_2$O, K$_2$O and Na$_2$O preferably in a proportion of about 10 weight % or less, more preferably in a proportion of about 2 to 5 weight %, relative to the entirety of the glass powder. The alkali metal oxide has a function of lowering the melting temperature. When the content of the alkali metal oxide is more than about 10 weight %, the Q value may be lowered.

In the present invention, the aforementioned insulator ceramic composition may contain zinc oxide, preferably in a proportion of about 15 weight % or less, more preferably in a proportion of about 10 weight % or less, in terms of ZnO. Zinc oxide has a function of lowering the firing temperature. When the content of the zinc oxide, however, is more than about 15 weight % in terms of ZnO, a fine sintered material may not be obtained. The aforementioned zinc oxide may be contained as a glass component.

In the present invention, copper oxide is contained preferably in a proportion of about 3 weight % or less, more preferably in a proportion of about 2 weight % or less relative to the entirety, in terms of CuO. Copper oxide has a function of lowering the firing temperature. When the content of the copper oxide, however, is more than about 3 weight %, the Q value may be lowered.

In a specified aspect of the present invention, when the composition in weight ratio of the aforementioned MgO—$MgAl_2O_4$ ceramic powder is represented by the formula, $xMgO$—$yMgAl_2O_4$, the x and y are preferably constituted fulfilling the relations $10 \leq x \leq 90$ and $10 \leq y \leq 90$ (where $x+y=100$), respectively. The reason x, indicating the weight percentage of MgO, is specified as being within the range about 1 to 90 is that when x is more than about 90, it may cause a problem in the moisture resistance of MgO. When less than about 10, it may cause an increase in the additive amount of the expensive glass in order to fire at 1000° C. or less.

In the present invention, the aforementioned ceramic powder and glass powder are blended in a proportion fulfilling the relation, ceramic powder: glass powder of preferably about 20:80 to 80:20, more preferably about 40:60 to 60:40, in weight ratio. When the blending ratio of the ceramic powder is higher than the aforementioned range, the density of the sintered material may be lowered, and when the blending ratio of the glass powder is higher than the aforementioned range, the Q value may be lowered.

In another specified aspect of the present invention, an insulator ceramic obtained by firing an insulator ceramic composition according to the present invention is provided. In this case, because the aforementioned insulator ceramic is obtained by firing the aforementioned insulator ceramic composition at a low temperature of 1000° C. or less, the aforementioned insulator ceramic composition can be fired together with low melting point metals such as silver and copper. Therefore, the insulator ceramic according to the present invention is appropriately used for ceramic multilayer substrates, etc., using conductive materials made of these low melting point metals.

In particular, because as the ceramic powder, a MgO—$MgAl_2O_4$ material exhibiting high Q in the high frequency band (Q x f value $\geq 70000$ GHz at 14 GHz), is used, even when the additive amount of the glass is reduced, it is possible to prepare at a temperature of 1000° C. or less, and the insulator ceramic exhibiting high Q value can be obtained.

The insulator ceramic according to the present invention preferably has a Q value of about 400 or more at a measuring frequency of 10 GHz. When the Q value is about 400 or more, it is possible to use as high frequency band circuit element substrates in recent years.

As the aforementioned glass powder, one obtained by calcining the glass composition at about 700 to 1400° C. may be used.

A ceramic multilayer substrate according to the present invention provides a ceramic board including an insulating ceramic layer made of the insulator ceramic composition according to the present invention, and a plurality of inner electrodes formed in the insulating ceramic layer of the ceramic board.

In the specified aspect of the ceramic multilayer substrate according to the present invention, a second ceramic layer exhibiting higher dielectric constant compared to the aforementioned insulating ceramic layer is laminated on at least one face of the aforementioned insulating ceramic layer.

In further specified aspect of the ceramic multilayer substrate according to the present invention, the plurality of inner electrodes are laminated interposing at least a part of the aforementioned insulating ceramic layer so as to constitute a monolithic capacitor.

In another specified aspect according to the present invention, a plurality of inner electrodes provide inner electrodes for a capacitor laminated interposing at least a part of the aforementioned insulating ceramic layer to constitute a capacitor, and coil conductors connected to each other to constitute a laminated inductor.

A ceramic electronic part according to the present invention provides a ceramic multilayer substrate according to the present invention and at least one electronic part being mounted on the ceramic multilayer substrate and constituting a circuit together with the plurality of inner electrodes.

In a specified aspect of the ceramic electronic part according to the present invention, a cap fixed on the aforementioned ceramic multilayer substrate is further provided surrounding the aforementioned electronic part element.

A conductive cap is preferably used as the cap.

In the specified aspect of the ceramic electronic part according to the present invention, a plurality of outer electrodes formed only on the bottom face of the aforementioned ceramic multilayer substrate, and a plurality of through hole conductors electrically connected to the aforementioned outer electrodes and electrically connected to the aforementioned inner electrode or electronic part element are further provided.

A laminated ceramic electronic part according to the present invention is characterized in providing a ceramic sintered material made of a insulator ceramic composition according to the present invention, a plurality of inner electrodes disposed in the aforementioned ceramic sintered material, and a plurality of outer electrodes formed on the outer surface of the ceramic sintered material and electrically connected to one of inner electrodes.

In a specified aspect of the laminated ceramic electronic part according to the present invention, the plurality of inner electrodes are disposed in a stack interposing a ceramic layer and thereby a capacitor unit is constituted.

In a further specified aspect of the laminated ceramic electronic part according to the present invention, the plurality of inner electrodes include a plurality of coil conductors connected to each other to constitute a laminated inductor unit in addition to the aforementioned inner electrodes constituting the aforementioned capacitor unit.

DESCRIPTION OF THE PREFERRED EMBODIMENTS

Figure 1:
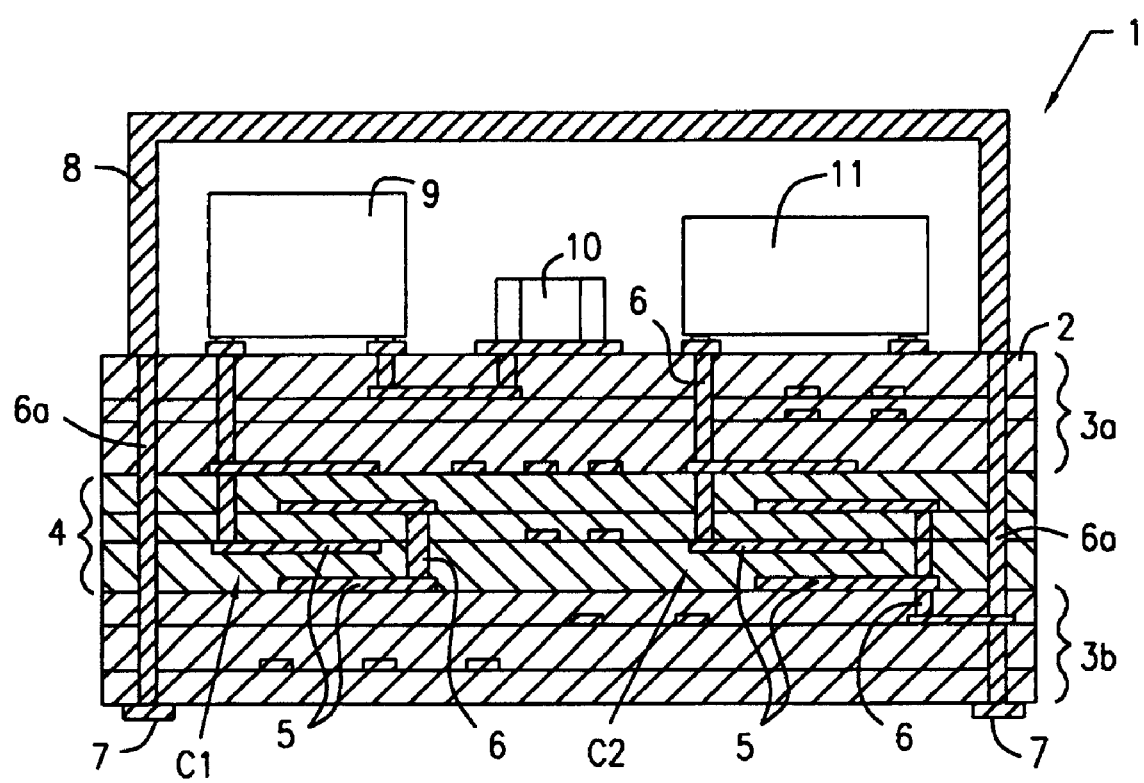
FIG. 1 is a vertical sectional view showing a ceramic laminated module as a ceramic electronic part using a ceramic multilayer substrate according to an example of the present invention.

The present invention will be made clear below by firstly explaining a specified example of an insulator ceramic according to the present invention, and then explaining structural examples of a ceramic multilayer substrate, a ceramic electronic part and a laminated ceramic electronic part according to the present invention.

An $Mg(OH)_2$ powder and an $Al_2O_3$ powder were prepared as raw material powders. Both aforementioned powders were weighed in order that when the composition in weight ratio of lastly obtained sintered material is represented by the formula, $xMgO—yMgAl_2O_4$, x and y fulfilling the relations $10 \leq x\ 90$, and $10 \leq y\ 90$ (where x+y=100), respectively, and were wet mixed for 16 hours, and thereafter were dried. The dried mixture was calcined at 1400° C. for 2 hours and thereafter was pulverized.

Then, as shown in Table 2 described below, 20 to 80 weight % of the material, calcined as described above, the glass powder (sintering assistant) having the composition as shown in Table 1 described below, and ZnO and CuO were blended in appropriate proportions as shown in Table 2 described below, and were granulated after adding an appropriate amounts of the binder. Each granulated mixture indicated by sample Nos. 1 to 52 was molded under a pressure of 200 MPa to obtain moldings in the shape of circular cylinder of 12 mm in diameter×7 mm thick.

The aforementioned moldings were fired in air at a temperature of 900 to 1000° C. for 2 hours to obtain insulator ceramics in the shape of circular cylinder indicated by sample Nos. 1 to 52 shown in Table 2 and Table 3.

Using each insulator ceramic in the shape of circular cylinder obtained as described above, the relative dielectric constant εr and the Q value at the resonant frequency (10 GHz) were measured by the both ends short-circuit dielectric resonance method. The results are shown in Table 2 and Table 3 described below.

Regarding the aforementioned insulator ceramics in the shape of circular cylinder, the three-point bending tests were made in accordance with JIS R1601, and the flexural strength was evaluated. In the samples indicated by sample Nos. 2 to 7, 9 to 29, 39 to 40 and 42 to 52, the relative densities were 98% or more and a high flexural strength of 200 MPa was exhibited.

TABLE 1

|  | $SiO_2$ (wt %) | $B_2O_3$ (wt %) | $Al_2O_3$ (wt %) | MgO (wt %) | BaO (wt %) | SrO (wt %) | CaO (wt %) | $Li_2O$ (wt %) |
| --- | --- | --- | --- | --- | --- | --- | --- | --- |
| A | 22 | 43 | 8 | 22 | — | — | — | 2 |
| B | 20 | 41 | 6 | 28 | — | — | — | 3 |
| C | 13 | 60 | 10 | 12 | — | — | — | 5 |
| D | 50 | 25 | 3 | 17 | — | — | — | 5 |
| E | 45 | 3 | 20 | 25 | — | — | — | 7 |
| F | 42 | 13 | 5 | — | — | — | 40 | — |
| G | 12 | 60 | 10 | 13 | — | — | — | 5 |
| H | 51 | 25 | 3 | 16 | — | — | — | 5 |
| I | 13 | 61 | 10 | 11 | — | — | — | 5 |
| J | 45 | 3 | 21 | 25 | — | — | — | 6 |
| K | 33 | 33 | — | — | — | — | 24 | 10 |
| L | 45 | 2 | 20 | 25 | — | — | — | 8 |
| M | 35 | 36 | 20 | — | 5 | 4 | — | — |
| N | 19 | 40 | — | 22 | — | — | 19 | — |
| O | 23 | 52 | 6 | 17 | — | — | — | 2 |
| P | 33 | 33 | — | — | — | — | 23 | 11 |
| Q | 22 | 35 | 12 | 22 | — | — | — | 9 |

TABLE 2

| No. | MgO (wt %) | $MgAl_2O_4$ (wt %) | Additive amount of glass (wt %) | Kind | ZnO (wt %) | CuO (wt %) | Firing temperature (° C.) | Relative density (%) | εr | Q |
| --- | --- | --- | --- | --- | --- | --- | --- | --- | --- | --- |
| 1 | 0 | 100 | 80 | A | 0 | 0 | 1000 | 96 | 6.9 | 350 |
| 2 | 10 | 90 | 90 | A | 0 | 0 | 1000 | 97 | 7.0 | 480 |
| 3 | 10 | 90 | 90 | A | 8 | 2 | 1000 | 97 | 7.0 | 700 |
| 4 | 20 | 80 | 80 | A | 0 | 3 | 1000 | 99 | 7.1 | 1000 |
| 5 | 50 | 50 | 45 | A | 15 | 1 | 900 | 99 | 7.1 | 3000 |
| 6 | 20 | 80 | 85 | A | 0 | 4 | 1000 | 99 | 7.1 | 500 |
| 7 | 90 | 10 | 80 | A | 10 | 3 | 1000 | 97 | 7.0 | 900 |
| 8 | 100 | 0 | 80 | A | 10 | 3 | 1000 | 96 | 6.9 | 350 |
| 9 | 50 | 50 | 45 | B | 10 | 2 | 900 | 100 | 7.1 | 3000 |
| 10 | 40 | 60 | 45 | B | 10 | 3 | 900 | 98 | 7.0 | 3200 |
| 11 | 60 | 40 | 50 | B | 9 | 2 | 900 | 98 | 7.0 | 2000 |
| 12 | 80 | 20 | 60 | B | 15 | 3 | 900 | 98 | 7.0 | 2000 |
| 13 | 80 | 20 | 60 | B | 16 | 3 | 900 | 97 | 7.0 | 500 |
| 14 | 90 | 10 | 70 | B | 10 | 2 | 900 | 97 | 7.0 | 800 |

TABLE 2-continued

| No. | MgO (wt %) | MgAl$_2$O$_4$ (wt %) | Additive amount of glass (wt %) | Kind | ZnO (wt %) | CuO (wt %) | Firing temperature (° C.) | Relative density (%) | εr | Q |
|---|---|---|---|---|---|---|---|---|---|---|
| 15 | 50 | 50 | 10 | B | 8 | 2 | 900 | 97 | 7.0 | 400 |
| 16 | 50 | 50 | 30 | C | 0 | 0 | 900 | 99 | 7.1 | 1000 |
| 17 | 60 | 40 | 40 | C | 7 | 0 | 900 | 99 | 7.0 | 1500 |
| 18 | 60 | 40 | 40 | C | 11 | 0 | 900 | 99 | 7.1 | 1700 |
| 19 | 70 | 30 | 20 | C | 15 | 1 | 1000 | 98 | 7.0 | 1600 |
| 20 | 70 | 30 | 20 | C | 0 | 3 | 1000 | 98 | 7.0 | 1200 |
| 21 | 50 | 50 | 10 | C | 0 | 0 | 1000 | 97 | 7.0 | 400 |
| 22 | 50 | 50 | 30 | D | 0 | 0 | 1000 | 98 | 7.1 | 800 |
| 23 | 40 | 60 | 50 | D | 13 | 1 | 1000 | 98 | 7.1 | 900 |
| 24 | 50 | 50 | 50 | E | 10 | 2 | 1000 | 98 | 7.1 | 500 |
| 25 | 50 | 50 | 50 | F | 4 | 2 | 900 | 100 | 7.5 | 500 |
| 26 | 60 | 40 | 50 | F | 6 | 3 | 900 | 99 | 7.4 | 400 |
| 27 | 40 | 60 | 50 | F | 8 | 2 | 900 | 98 | 7.3 | 400 |
| 28 | 40 | 60 | 50 | F | 15 | 4 | 900 | 98 | 7.3 | 350 |
| 29 | 50 | 50 | 40 | F | 15 | 2 | 1000 | 99 | 7.5 | 500 |
| 30 | 50 | 50 | 60 | G | 5 | 2 | 1000 | 97 | 7.0 | 350 |
| 31 | 50 | 50 | 70 | G | 8 | 0 | 1000 | 97 | 7.1 | 320 |

TABLE 3

| No. | MgO (wt %) | MgAl$_2$O$_4$ (wt %) | Additive amount of glass (wt %) | Kind | ZnO (wt %) | CuO (wt %) | Firing temperature (° C.) | Relative density (%) | εr | Q |
|---|---|---|---|---|---|---|---|---|---|---|
| 32 | 50 | 50 | 40 | G | 10 | 2 | 1000 | 96 | 6.9 | 380 |
| 33 | 60 | 40 | 60 | H | 0 | 0 | 1000 | 97 | 7.0 | 350 |
| 34 | 50 | 50 | 70 | H | 13 | 1 | 1000 | 97 | 7.0 | 380 |
| 35 | 50 | 50 | 30 | I | 0 | 0 | 900 | 97 | 7.0 | 360 |
| 36 | 60 | 40 | 40 | I | 7 | 0 | 900 | 97 | 7.0 | 380 |
| 37 | 70 | 30 | 80 | I | 0 | 3 | 1000 | 97 | 7.0 | 380 |
| 38 | 50 | 50 | 50 | J | 10 | 2 | 1000 | 96 | 6.9 | 360 |
| 39 | 50 | 50 | 60 | K | 13 | 3 | 1000 | 98 | 7.0 | 900 |
| 40 | 50 | 50 | 80 | K | 13 | 3 | 1000 | 98 | 7.0 | 700 |
| 41 | 50 | 50 | 50 | L | 10 | 2 | 1000 | 96 | 6.9 | 350 |
| 42 | 60 | 40 | 40 | M | 7 | 0 | 900 | 99 | 7.1 | 500 |
| 43 | 50 | 50 | 30 | M | 0 | 0 | 1000 | 97 | 7.0 | 450 |
| 44 | 50 | 50 | 50 | N | 4 | 2 | 1000 | 98 | 7.1 | 450 |
| 45 | 50 | 50 | 60 | O | 0 | 0 | 1000 | 97 | 7.1 | 500 |
| 46 | 50 | 50 | 70 | O | 11 | 0 | 1000 | 97 | 7.0 | 800 |
| 47 | 60 | 40 | 60 | O | 15 | 0 | 1000 | 98 | 7.1 | 1000 |
| 48 | 50 | 50 | 60 | P | 13 | 3 | 1000 | 97 | 7.1 | 650 |
| 49 | 60 | 40 | 60 | P | 0 | 2 | 1000 | 97 | 7.0 | 400 |
| 50 | 40 | 60 | 60 | P | 0 | 2 | 1000 | 97 | 7.0 | 450 |
| 51 | 50 | 50 | 50 | Q | 0 | 3 | 1000 | 97 | 7.0 | 500 |
| 52 | 50 | 50 | 50 | Q | 0 | 4 | 1000 | 98 | 7.1 | 400 |

In the sample No. 1, MgO was not present and in the sample No. 8, MgAl$_2$O$_4$ was not present. In both cases, the relative densities were as low as 96% and the Q values were as low as 350.

In the sample Nos. 30 to 32, because the glass G as shown in Table 1 was used the relative densities was 97% or less and the Q values were 380 or less.

Similarly, in sample Nos. 33 and 34, sample Nos. 35 to 37, sample No. 38 and sample No. 41, because the glass H, I, J and K as shown in Table 1 were used, respectively, the relative densities were as low as 97% or less and the Q values were as low as 380 or less.

That is, in the insulator ceramics of samples being out of the scope of the present invention, when these were fired at a low temperature of 1000° C. or less, the relative densities were as low as 97% or less and the Q values were as low as 380 or less.

On the other hand, in the insulator ceramics according to the present invention, even when these were fired at a low temperature of 1000° C. or less, the relative densities were as high as 98% or more, superior mechanical strength were exhibited (200 MPa or more), and furthermore the dielectric constants were small and the Q values were as high as 400 or more at the measuring frequency of 10 GHz. It is understand therefore that insulator ceramic compositions being most appropriate for high frequency electronic parts and capable of being fired at a low temperature can be provided.

Next, a structural example of a ceramic multilayer substrate, a ceramic electronic part and a laminated ceramic electronic part using the insulator ceramic according to the present invention will be explained.

Figure 2:
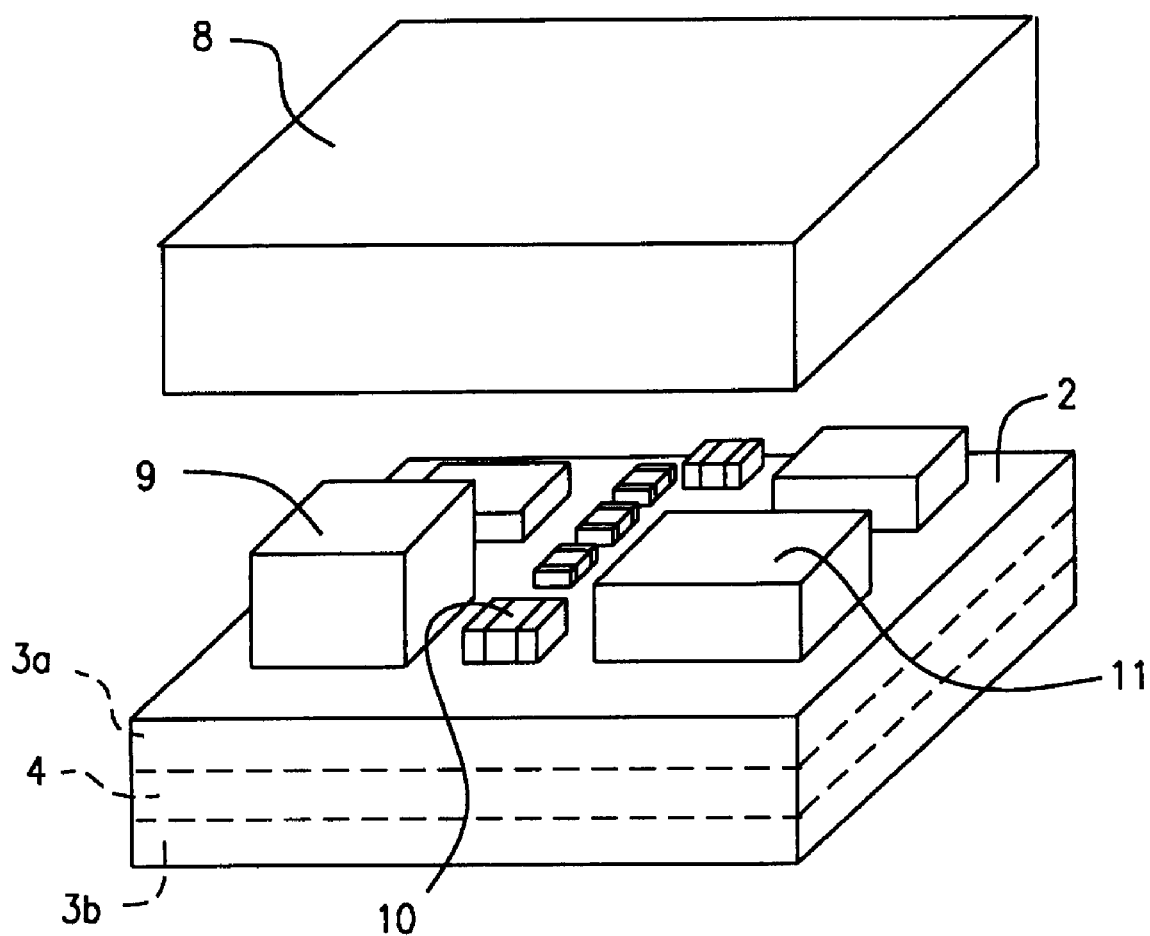
FIG. 2 is a perspective assembly drawing of the ceramic multilayer module shown in FIG. 1.

FIG. 1 is a sectional view showing a ceramic multilayer module as a ceramic electronic part including a ceramic multilayer substrate according to an example of the present invention, and FIG. 2 is a perspective assembly drawing thereof.

A ceramic multilayer module 1 is constituted using a ceramic multilayer substrate 2.

In the ceramic multilayer substrate 2, a dielectric ceramic layer 4 made by, for example, adding the glass to barium titanate, and exhibiting relatively high dielectric constant, is interposed between insulating ceramic layers 3a and 3b made of an insulator ceramic composition according to the present invention.

In the dielectric ceramic layer 4, a plurality of inner electrodes 5 are disposed neighboring on each other while interposing one of the dielectric ceramic layer 4, and thereby monolithic capacitor units C1 and C2 are constituted.

A plurality of via hole electrodes 6 and 6a, and inner wirings are formed in the insulating ceramic layers 3a and 3b and the dielectric ceramic layer 4.

On the other hand, electronic part elements 9 to 11 are mounted on the top face of the ceramic multilayer substrate 2. As the electronic part elements 9 to 11, appropriate electronic part elements such as semiconductor devices and chip monolithic capacitors can be used. These electronic part elements 9 to 11 and capacitor units C1 and C2 are electrically connected via the aforementioned via hole electrode 6 and inner wirings to constitute a circuit of the ceramic multilayer module 1 according to the present example.

A conductive cap 8 is fixed on the top face of the aforementioned ceramic multilayer substrate 2. The conductive cap 8 is electrically connected to the via hole electrode 6 penetrating the ceramic multilayer substrate 2 from the top face toward the bottom face. Outer electrodes 7,7 are formed on the bottom face of the ceramic multilayer substrate 2, and the outer electrodes 7,7 are electrically connected to the via hole electrodes 6 and 6a. Other outer electrodes, not illustrated in the drawings, similarly to the aforementioned outer electrode 7, are formed only on the bottom face of the ceramic multilayer substrate 2. The other outer electrodes are electrically connected to the electronic part elements 9 to 11 and capacitor units C1 and C2 via the aforementioned inner wirings.

By forming the outer electrode 7 for external connecting only on the bottom face of the ceramic multilayer substrate 2, the ceramic laminated module can be easily surface mounted on printed circuit substrates, etc., using the bottom face side.

In the present example, because the cap 8 is made of a conductive material and is electrically connected to the outer electrode 7 via the via hole electrode 6, the electronic part elements 9 to 11 can be electromagnetically shielded by the conductive cap 8. The cap 8, however, is not necessary to be composed of a conductive material.

In the ceramic multilayer module 1 according to the present example, because the aforementioned insulating ceramic layers 3a and 3b use the insulator ceramic according to the present invention, the dielectric constant is low, and Q value is high so that a ceramic multilayer module 1 appropriate for use at high frequencies can be provided. In addition, because the aforementioned insulating ceramic layers 3a and 3b exhibit superior mechanical strength, a ceramic multilayer module 1, also exhibiting superior mechanical strength, can be constituted.

The aforementioned ceramic multilayer substrate 2 can be easily obtained using the well-known ceramic laminate integral firing technique. That is, ceramic green sheets mainly composed of the insulator ceramic material according to the present invention are prepared, are printed with electrode patterns for constituting the inner electrodes 5, outer circuits and the via hole electrodes 6 and 6a, etc., and are laminated. Furthermore, an appropriate number of ceramic green sheets for forming the insulating ceramic layers 3a and 3b on the top and bottom thereof, on which electrode patterns for constituting the outer circuits, and the via hole electrodes 6 and 6a are formed, are laminated and pressed in the direction of the thickness. By firing thus obtained laminate, the ceramic multilayer substrate 2 is easily obtained.

Figure 3:
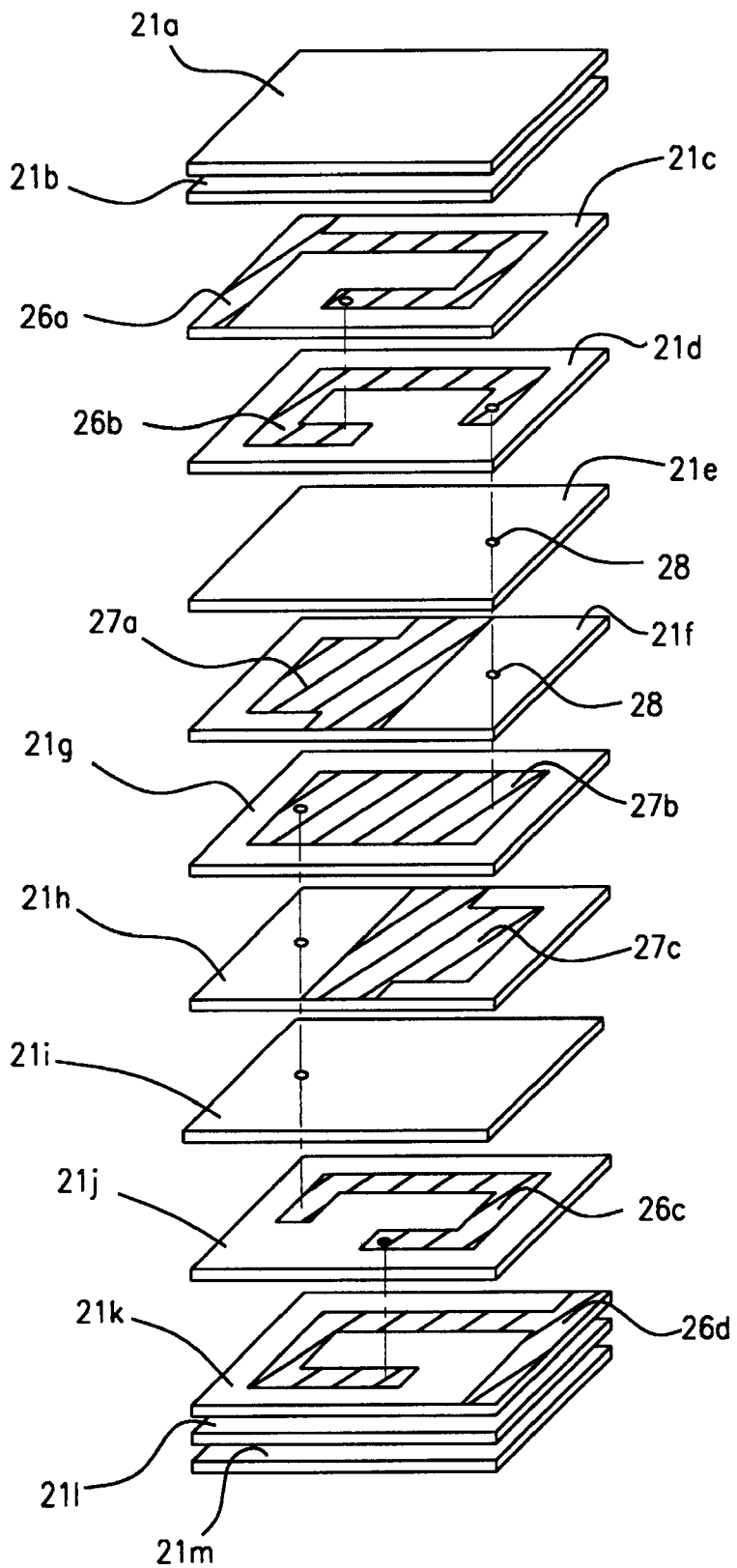
FIG. 3 is a perspective assembly drawing for explaining a ceramic green sheet, used to manufacture the laminated ceramic electronic part according to the second example of the present invention, and electrode patterns formed thereon.
Figure 4:
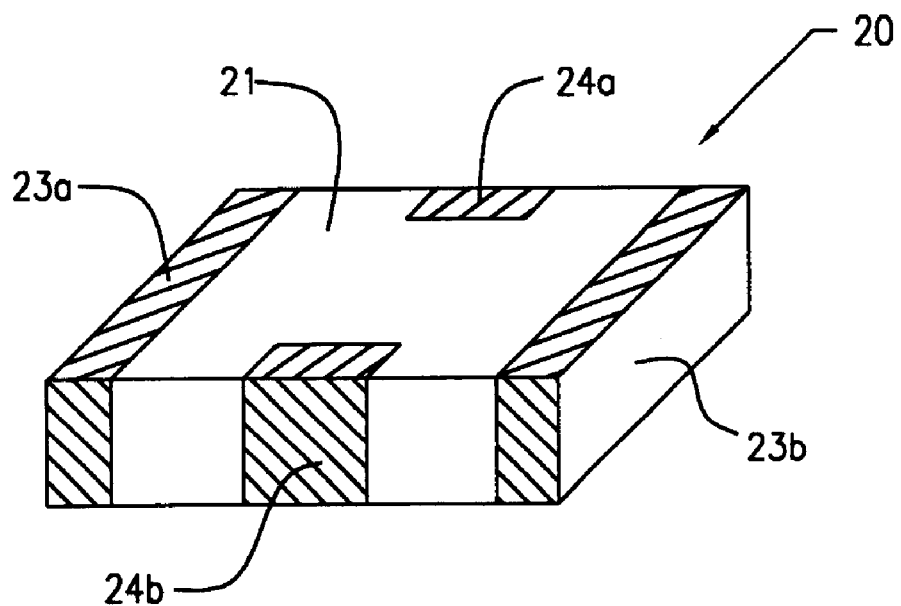
FIG. 4 is a perspective view of a laminated ceramic electronic part according to the second example of the present invention.
Figure 5:
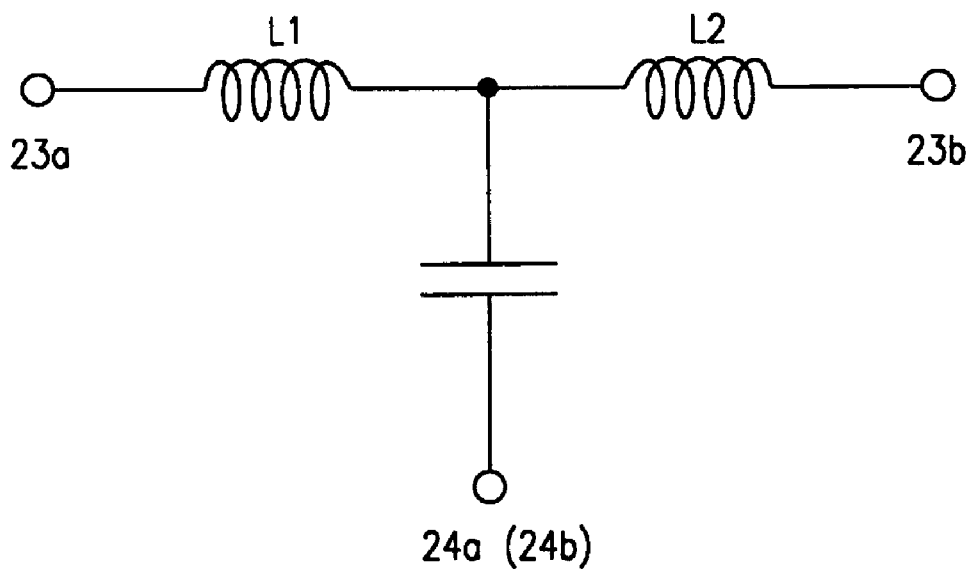
FIG. 5 is a diagram of a circuit constitution of the laminated ceramic electronic part shown in FIG. 4.

FIG. 3 to FIG. 5 are a perspective assembly drawing, a perspective appearance drawing and a circuit diagram for explaining a laminated ceramic electronic part as the second structural example according to the present invention. The laminated ceramic electronic part 20 shown in FIG. 4 is an LC filter. In a ceramic sintered material 21, a circuit constituting the inductance L and the capacitance C is constituted as described below. The ceramic sintered material 21 is constituted using the insulator ceramic according to the present invention. Outer electrodes 23a, 23b, 24a and 24b are formed on the outer surface of the ceramic sintered material 21, and an LC resonant circuit shown in FIG. 5 is constituted between the outer electrodes 23a, 23b, 24a and 24b.

Next, the constitution of the aforementioned ceramic sintered material 21 will be made clear by the explanation of manufacturing method with reference to FIG. 3.

An organic vehicle is added to the insulator ceramic material according to the present invention to obtain ceramic slurry. The ceramic slurry is shaped into the ceramic green sheet using an appropriate sheet molding method. Thus obtained ceramic green sheet is dried, and thereafter is punched to prepare rectangular ceramic green sheets 21a to 21m of prescribed size.

If necessary, a penetrated hole for constituting a via hole electrode 28, is formed in the ceramic green sheets 21a to 21m. Furthermore, a conductive paste is screen printed to form coil conductors 26a and 26b, inner electrodes 27a to 27c for a capacitor and coil conductors 26c and 26d, and a conductive paste is filled into the aforementioned penetrated hole for the via hole 28 to form the via hole electrode 28.

Then, the ceramic green sheets 21a to 21m are laminated in the situation as shown in the drawing, and are pressed in the direction of the thickness to obtain a laminate.

The obtained laminate is fired to obtain the ceramic sintered material 21.

Outer electrodes 23a to 24b are formed as shown in FIG. 4 on the ceramic sintered material 21 obtained as described above, using a thin film making method, for example, coating and baking of conductive paste, vapor deposition, and plating or sputtering, etc. The laminated ceramic electronic part 20 can be made thus.

As it is clear from FIG. 3, an inductance unit L1 shown in FIG. 5 is composed of the coil conductors 26a and 26b, an inductance unit L2 is composed of the coil conductors 26c and 26d, and a capacitor C is composed of the inner electrodes 27a to 27c.

In the laminated ceramic electronic part 20 of the present example, the LC filter is constituted as described above. Because the ceramic sintered material 21 is constituted using the insulator ceramic according to the present invention, similarly to the ceramic multilayer substrate 2 according to the first example, it can be obtained by a low temperature firing, and therefore can be integrally fired with the ceramics using low melting point metals, for example, copper, silver and gold as the aforementioned coil conductors 26a to 26c for the inner electrodes, or as the inner electrodes 27a to 27c for the capacitor. In addition, the LC filter, exhibiting high Q value in high frequencies, and being appropriate for use at high frequencies, can be constituted. Furthermore, because the aforementioned insulator ceramic exhibits high mechanical strength, a LC filter also exhibiting superior mechanical strength can be provided.

In the aforementioned first and second structural examples, the ceramic multilayer module 1 and the laminated ceramic electronic part 20 constituting the LC filter were explained as examples, but the ceramic electronic part, however, and the laminated ceramic electronic part according to the present invention are not limited to these structures. That is, it can be applied to various ceramic multilayer substrates such as ceramic multilayer substrates for multichip modules and ceramic multilayer substrates for Hybrid ICs or various ceramic electronic parts in which electronic part elements are mounted on these ceramic multilayer substrates, and furthermore, to various chip type laminated electronic parts such as chip type monolithic capacitors and chip type laminated dielectric antennas.

In the insulator ceramic according to the present invention, because the $MgO$—$MgAl_2O_4$ ceramic powder and the glass powder having the aforementioned specified composition are present, it is possible to fire at a low temperature of 1000° C. or less. Because it is possible to fire together with the conductor materials made of low melting point metals such as copper and silver, and these conductor materials can be used for inner electrodes, etc., the insulator ceramic composition according to the present invention can be appropriately used for the ceramic multilayer substrates which can be obtained by the low temperature firing, and the costs of multilayer substrates, etc., can be reduced. In addition, the insulator ceramic obtained by firing the insulator ceramic composition according to the present invention exhibits a high Q value in the high frequency band, so that high frequency multilayer substrates exhibiting high Q values, etc., can be provided.

In the present invention, in the case in which the aforementioned glass powder further contains at least an alkaline earth metal oxide selected from the group consisting of BaO, SrO, CaO and MgO in a proportion of about 10 to 40 parts by weight relative to the aforementioned glass powder of 100 parts by weight, the melting temperature in the manufacturing of the glass powder can be lowered, and the preparation cost of the insulator ceramic composition according to the present invention can be reduced.

In the case in which the aforementioned glass powder contains at least one alkali metal oxide selected from the group consisting of $Li_2O$, $K_2O$ and $Na_2O$ in a proportion of about 10 weight % or less, relative to the entirety of the glass powder, similarly, the melting temperature in the manufacturing of the glass powder can be lowered, the preparation cost of the glass powder can be reduced and the lowering of the Q value can be suppressed.

Furthermore, in the case in which the aforementioned insulator ceramic composition contains zinc oxide in a proportion of about 15 weight % or less in terms of ZnO, the firing temperature of the insulator ceramic composition can be lowered and fine sintered materials can be obtained.

In the case in which copper oxide is contained in a proportion of about 3 weight % or less relative to the entirety, in terms of CuO, similarly, the firing temperature can be lowered and an insulator ceramic exhibiting high Q value can be obtained. When the composition in weight ratio of the aforementioned $MgO$—$MgAl_2O_4$ ceramic powder is represented by the formula, $xMgO$—$yMgAl_2O_4$, where $10 \leq x \leq 90$ and $10 \leq y \leq 90$ (where x+y=100), respectively, a fine sintered material can be obtained by low temperature firing, and even when it is fired at a low temperature, the usage of the glass powder can be reduced, and the insulator ceramic, exhibiting low dielectric constant and high Q value in the high frequency band, can be surely obtained.

In the case in which the aforementioned ceramic powder and glass powder are contained in a proportion fulfilling the relation, ceramic powder: glass powder=about 20:80 to 80:20 in weight ratio, a finer insulator ceramic can be obtained, and the lowering of the Q value can be supressed by using the glass powder.

Because the insulator ceramic according to the present invention can be obtained by firing the insulator ceramic composition according to the present invention, it can be obtained with the low temperature firing, and therefore the cost of the insulator ceramic can be reduced. In addition, the insulator ceramic according to the present invention exhibits superior mechanical strength, high Q value and low dielectric constant. Therefore, by using in, for example, ceramic substrates and ceramic multilayer substrates, ceramic substrates and ceramic multilayer substrates exhibiting superior mechanical strength and high Q values can be obtained.

Because the ceramic multilayer substrate according to the present invention provides the ceramic board including the insulating ceramic layer made of the insulator ceramic according to the present invention, it can be fired at a low temperature, and low resistance and inexpensive metals such as copper and silver can be used as materials for constituting the inner electrodes. Furthermore, because the insulating ceramic layer exhibits high mechanical strength, low dielectric constant and high Q value, a ceramic multilayer substrate being appropriate for using high frequencies.

In the case in which a second ceramic layer exhibiting higher dielectric constant compared to the aforementioned insulating ceramic layer is laminated on at least a face of the insulating ceramic layer, by contriving the composition and the lamination form of the second ceramic layer, the strength and the environmental tolerance characteristics can be appropriately controlled in accordance with requirements.

In the case in which the plurality of inner electrodes are laminated interposing at least a part of the insulating ceramic layer and thereby a monolithic capacitor is constituted, because the dielectric constant of the insulator ceramic according to the present invention is low and the Q value is high, it is appropriate for using high frequencies.

Furthermore, because the insulator ceramic according to the present invention exhibits high mechanical strength, a monolithic capacitor exhibiting superior mechanical strength can be constituted.

In the case in which the plurality of inner electrodes include the inner electrodes constituting the monolithic capacitor and a plurality of coil conductors connected to each other to constitute the laminated inductor, because the insulator ceramic according to the present invention exhibits low dielectric constant, high Q value in high frequencies and high mechanical strength, a small LC resonant circuit appropriate for use at high frequencies can be easily constituted.

In the ceramic electronic parts according to the present invention in which at least an electronic part element is laminated on the ceramic multilayer substrates according to the present invention, using the aforementioned electronic part element and the circuit constitution in the ceramic multilayer substrates, various small ceramic electronic parts appropriate for using high frequencies can be provided.

In the case in which the cap is fixed on the ceramic multilayer substrate surrounding the electronic part element, because the electronic part element can be protected with the cap, the ceramic electronic parts exhibiting superior moisture resistance, etc., can be provided.

In the case in which a conductive cap is used as the cap, the surrounded electronic part element can be electromagnetically shielded.

In the case in which the outer electrode is formed only on the bottom face of the ceramic multilayer substrate, it is possible to easily surface mount on printed circuit substrates, etc., from the bottom face side of the ceramic multilayer substrate.

In the laminated ceramic electronic parts according to the present invention, because the plurality of inner electrodes are formed in the insulator ceramic according to the present invention, it is possible to fire at a low temperature, and low resistance and inexpensive metals such as Ag and Cu can be used as the constitution materials of the inner electrode. Furthermore, in the insulator ceramic, the dielectric constant is low and the Q value is high, and therefore a monolithic capacitor being appropriate for use at high frequencies can be provided. Because the aforementioned insulator ceramic exhibits high mechanical strength, a monolithic capacitor exhibiting superior mechanical strength can be constituted.

In the laminated ceramic electronic parts according to the present invention, in the case in which the plurality of inner electrodes constitute the monolithic capacitor, because the insulator ceramic according to the present invention exhibits low dielectric constant and high Q value, it is appropriate for using high frequencies.

In the laminated ceramic electronic parts according to the present invention, in the case in which the plurality of inner electrodes include the inner electrodes constituting the monolithic capacitor and coil conductors constituting the laminated inductor, because the insulator ceramic according to the present invention exhibits superior mechanical strength, exhibits low dielectric constant and high Q value in high frequencies, as described above, a LC resonant circuit exhibiting high mechanical strength, and being appropriate for use at high frequencies can be easily constituted.

What is claimed is:

1. An insulator ceramic composition comprising: (A) an $MgO$—$MgAl_2O_4$ ceramic powder, (B) a glass powder containing silicon oxide in a proportion of about 13 to 50 weight % in terms of $SiO_2$, boron oxide in a proportion of about 3 to 60 weight % in terms of $B_2O_3$, aluminum oxide in a proportion of 0 to about 20 weight % in terms of $Al_2O_3$, (C) at least one alkali metal oxide selected from the group consisting of $Li_2O$, $K_2O$ and $Na_2O$ in a proportion of about 10 weight % or less relative to the entirety of said glass powder, (D) zinc oxide in a proportion of about 15 weight % or less in terms of ZnO relative to the composition, and (E) copper oxide in a proportion of about 3 weight % or less in terms of CuO relative to the entirety of said glass powder.

2. An insulator ceramic composition according to claim 1, wherein said glass powder contains at least an alkaline earth metal oxide selected from the group consisting of BaO, SrO, CaO and MgO in a proportion of about 10 to 40 weight % relative to the entirety of said glass powder.

3. An insulator ceramic composition according to claim 2 wherein, the composition weight ratio of said $MgO$—$MgAl_2O_4$ ceramic powder is represented by the formula $xMgO$—$yMgAl_2O_4$, where $10 \leq x \leq 90$, $10 \leq y \leq 90$ and $x+y=100$.

4. An insulator ceramic composition according to claim 3, wherein said ceramic powder and said glass powder are in a proportion of ceramic powder: glass powder of about 20:80 to 80:20 by weight.

5. An insulator ceramic composition according to claim 1, wherein said glass powder contains an amount greater than 0% of said at least one alkali metal oxide.

6. An insulator ceramic composition according to claim 1, wherein said insulator ceramic composition contains an amount greater than 0% of said zinc oxide.

7. An insulator ceramic composition according to claim 1, wherein said insulator ceramic composition contains an amount greater than 0% of said copper oxide.

8. An insulator ceramic composition according to claim 1 wherein the composition weight ratio of said $MgO$—$MgAl_2O_4$ ceramic powder is represented by the formula $xMgO$—$yMgAl_2O_4$, where $10 \leq x \leq 90$, $10 \leq y \leq 90$ and $x+y=100$.

9. An insulator ceramic composition according to claim 1, wherein said ceramic powder and said glass powder are in a proportion of ceramic powder: glass powder of about 20:80 to 80:20 by weight.

10. An insulator ceramic comprising a fired insulator ceramic composition according to claim 1.

11. A ceramic multilayer substrate comprising a ceramic board including an insulating ceramic layer of the insulator ceramic composition according to claim 10 and a plurality of inner electrodes within said insulating ceramic layer of said ceramic board.

12. A ceramic multilayer substrate according to claim 11, having a second ceramic layer exhibiting higher dielectric constant compared to said insulating ceramic layer laminated on at least one face of said insulating ceramic layer.

13. A ceramic multilayer substrate according to claim 11, wherein said plurality of inner electrodes are laminated with at least a part of said insulating ceramic layer interposing therebetween so as to constitute a capacitor.

14. A ceramic multilayer substrate according to claim 13, wherein a pair of inner electrodes are laminated interposing at least a part of said insulating ceramic layer to constitute the capacitor, and others of plurality of inner electrodes comprise coil conductors connected to each other to constitute an inductor.

15. An insulator ceramic comprising a fired insulator ceramic composition according to claim 4.

16. A ceramic multilayer substrate comprising a ceramic board including an insulating ceramic layer of the insulator ceramic composition according to claim 15 and a plurality of inner electrodes within said insulating ceramic layer of said ceramic board.

17. A ceramic multilayer substrate according to claim 16, having a second ceramic layer exhibiting higher dielectric constant compared to said insulating ceramic layer laminated on at least one face of said insulating ceramic layer.

18. A ceramic multilayer substrate according to claim 16, wherein said plurality of inner electrodes are laminated with at least a part of said insulating ceramic layer interposing therebetween so as to constitute a capacitor.

19. A ceramic multilayer substrate according to claim 16, wherein a pair of inner electrodes are laminated interposing at least a part of said insulating ceramic layer to constitute the capacitor, and others of said plurality of inner electrodes comprise coil conductors connected to each other to constitute an inductor.

* * * * *